United States Patent [19]

Tsugami

[11] Patent Number: 5,177,757
[45] Date of Patent: Jan. 5, 1993

[54] SEMICONDUCTOR LASER PRODUCING VISIBLE LIGHT

[75] Inventor: Mari Tsugami, Itami, Japan

[73] Assignee: Mitsubishi Denki Kabushiki Kaisha, Tokyo, Japan

[21] Appl. No.: 716,822

[22] Filed: Jun. 17, 1991

[30] Foreign Application Priority Data

Jun. 18, 1990 [JP] Japan ................................ 2-161022

[51] Int. Cl.⁵ .............................................. H01S 3/19
[52] U.S. Cl. .................................................... 372/45
[58] Field of Search ............................. 372/46, 45, 44

[56] References Cited

U.S. PATENT DOCUMENTS

| 4,922,499 | 5/1990 | Nitta et al. | 372/46 |
| 5,023,199 | 6/1991 | Murakami et al. | 437/167 |
| 5,042,045 | 8/1991 | Sato | 372/46 |

FOREIGN PATENT DOCUMENTS

| 0234955 | 9/1987 | European Pat. Off. . |
| 0328134 | 8/1989 | European Pat. Off. . |
| 0348941 | 1/1990 | European Pat. Off. . |
| 63-81884 | 4/1988 | Japan . |
| 1-145882 | 6/1989 | Japan . |
| 1-175278 | 7/1989 | Japan . |
| 1-175279 | 7/1989 | Japan . |
| 1-179489 | 7/1989 | Japan . |
| 2-33990 | 2/1990 | Japan . |
| 2-109388 | 4/1990 | Japan . |

OTHER PUBLICATIONS

Tanaka et al, "Transverse-Mode Stabilized Ridge Stripe AlGaInP Semiconductor Lasers Incorporating A Thin GaAs Etch-Stop Layer", Applied Physics Letters, vol. 54, No. 15, Apr. 1989, pp. 1391-1393.
Gomyo et al, "Evidence For The Existence . . . Band-Gap Energy", Applied Physics Letters, vol. 50, No. 11, 1987, pp. 673-675.

Primary Examiner—James W. Davie
Attorney, Agent, or Firm—Leydig, Voit & Mayer

[57] ABSTRACT

A semiconductor laser producing visible light includes a first conductivity type semiconductor substrate, a first conductivity type AlGaInP cladding layer containing a first dopant impurity and disposed on the substrate, a semiconductor first spacer layer disposed on the cladding layer, an undoped InGaP active layer disposed on the first spacer layer wherein the first spacer layer inhibits intrusion of the first dopant impurity into the active layer, a semiconductor second spacer layer disposed on the active layer, a second conductivity type AlGaInP light guide layer containing a second dopant impurity and disposed on the active layer wherein the second spacer layer inhibits intrusion of the second dopant impurity into the active layer, a second conductivity type semiconductor current concentration and collection structure disposed on the light guide layer, and first and second electrodes disposed on the substrate and the current concentration and collection structure, respectively.

23 Claims, 4 Drawing Sheets

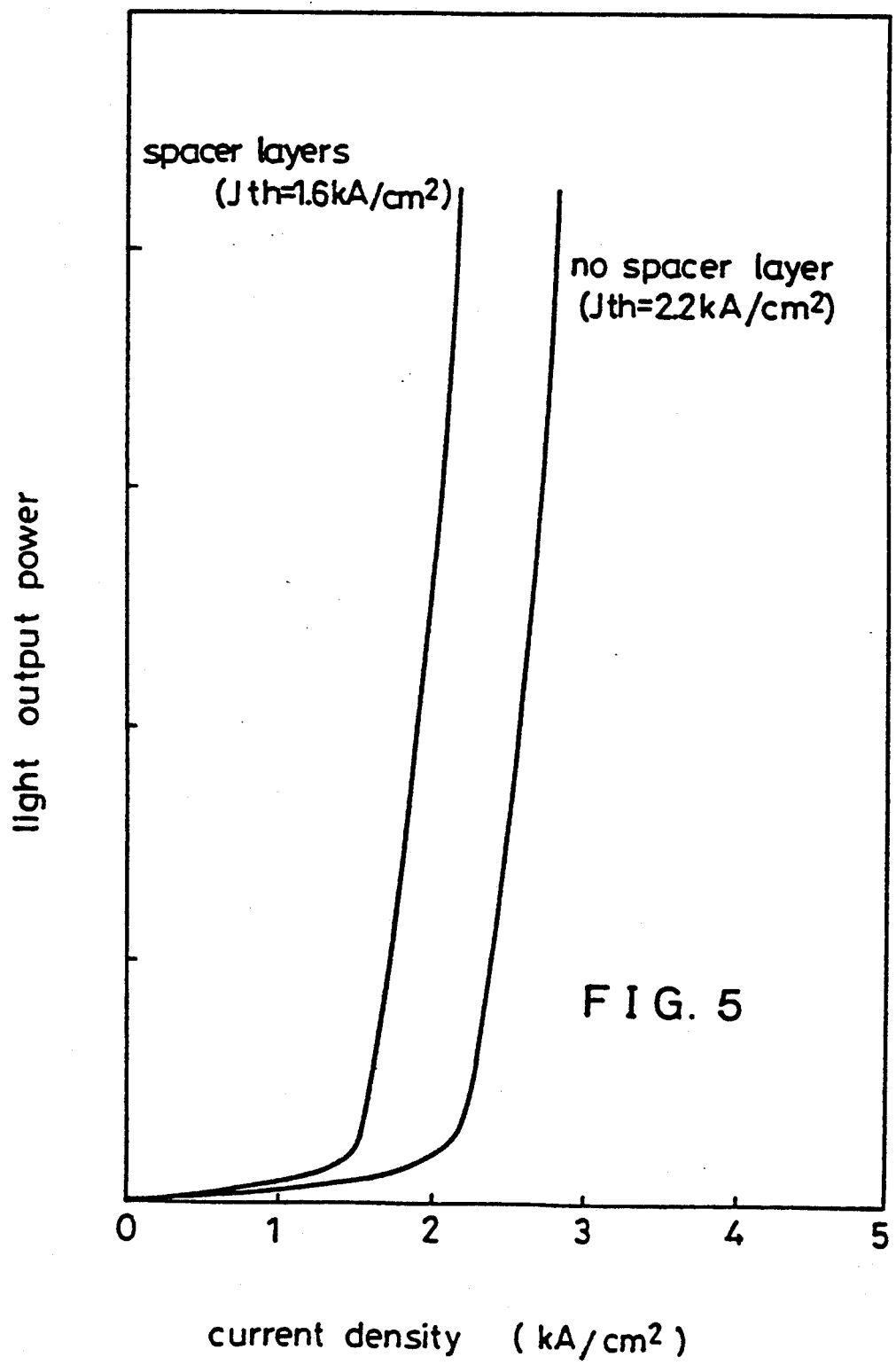

SEMICONDUCTOR LASER PRODUCING VISIBLE LIGHT

FIELD OF THE INVENTION

The present invention relates to a semiconductor laser producing light visible to the naked eye and, more particularly, to a semiconductor laser producing visible light and having a long lifetime.

BACKGROUND OF THE INVENTION

FIG. 2 is a cross-sectional view showing the structure of a prior art semiconductor laser producing visible light, i.e., light visible to the naked eye. The laser includes an n-type gallium arsenide (GaAs) substrate 1 on which numerous layers are successively disposed. An n-type aluminum gallium indium phosphide (AlGaInP) cladding layer 2 is disposed on the substrate 1, an undoped indium gallium phosphide (InGaP) active layer 4 is disposed on the cladding layer 2, a p-type AlGaInP light guide layer 5 is disposed on the active layer 4, and a p-type InGaP etch stopping layer 6 is disposed on the light guide layer 5. Those layers 2, 4, 5, and 6 are all successively grown on the substrate 1 by conventional techniques, for example, by metal organic chemical vapor deposition (MOCVD). A current blocking layer 12 and mesa structure 13 are disposed on the etch stopping layer 6 to concentrate the current flow in the central portion of the active layer 4 and to form a loss guide structure for transverse oscillation mode stabilization.

To form the mesa structure and current blocking layer, initially a p-type AlGaInP cladding layer 7, a p-type InGaP transition layer 8, and a p-type GaAs contacting layer 9a are successively grown on the etch stopping layer 6. Thereafter, an etching mask is formed on part of the contacting layer 9a and the mesa 13 is formed by etching the unmasked portions of layers 7, 8, and 9a. An etchant that etches AlGaInP far more rapidly than InGaP is employed. Thus, when the etch stopping layer 6 is exposed, the rate of etching declines rapidly and damage to the underlying light guide layer 5 that would occur if the etch stopping layer 6 were absent is avoided.

The current blocking layer 12 of n-type GaAs is grown on the etch stopping layer 6 at both sides of the mesa 13. By using MOCVD or another selective growth process with the etching mask still in place on the remaining contacting layer 9a, the current blocking layer 12 does not grow on top of the mesa 13. Finally, a second p-type contacting layer 9b is grown on the top of the mesa 13 and on the current blocking layer 12 after the etching mask is removed. Electrodes 10 and 11 are formed on the substrate 1 and the second contacting layer 9b, respectively, to complete the semiconductor laser. Either before or after the electrodes are formed, the structure is cleaved to form the opposed facets of the laser.

The prior art laser structure is described above without specification of the relative concentrations of the various elements in the ternary and quaternary alloys. The undoped active layer 4 in a semiconductor laser producing visible light typically is usually approximately $Ga_{0.5}In_{0.5}P$. The light guide layer 5 and the cladding layers 2 and 7 are usually approximately $Al_{0.28}Ga_{0.23}In_{0.49}P$. Likewise, in the structure of FIG. 2, the transition layer 8 is intended to have an energy band gap intermediate those of the layers 7 and 9a to reduce the voltage drop that occurs when the GaAs contacting layer directly contacts the AlGaInP cladding layer. In this laser structure, transverse mode oscillation is stabilized by a loss guide structure. Light produced in the active layer 4 that reaches the current blocking layer 12 is absorbed because of the smaller energy band gap of GaAs. Within the mesa 13, the light is not absorbed because of the larger energy band gap of the AlGaInP cladding layer 7. The loss guide structure concentrates light at the mesa 13, stabilizing the oscillation mode of the laser.

The conductivity types of the layers of the laser of FIG. 2 are determined during growth by including appropriate dopant impurities in the growing layers. For example, the dopant impurity that typically provides p-type conductivity in the light guide layer 5 and the cladding layer 7 is zinc (Zn). The dopant impurity used to produce n-type conductivity in the cladding layer 2 is typically selenium (Se) or silicon (Si). When Zn is employed as a p-type dopant impurity in AlGaInP, e.g., in the light guide layer 5 and the cladding layer 7, it has been observed to have a relatively low degree of electrical activity. In other words, a relatively small proportion, for example, only forty percent, of the incorporated Zn atoms are ionized and act as acceptors. The remainder of the Zn does not affect the electrical properties of the laser. To compensate for that low degree of ionization, a relatively large amount of Zn is incorporated into the growing layers. The diffusion coefficient of Zn in AlGaInP is larger than that in GaInP. As a result of a relatively high concentration of Zn and the relative diffusion coefficients of Zn in the cladding and active layers, unusual dopant impurity concentrations can occur in the laser structure. Those dopant impurity concentration abnormalities are accentuated by a known interaction between Zn and Se.

The unusual dopant impurity concentrations that can occur in the laser structure of FIG. 2 are illustrated in FIG. 3. There, the relative concentrations of Zn and Se in the cladding layer 2, the active layer 4, and the light guide layer 5 are plotted as a function of position. The expected concentration of Zn in the layer 4, absent the high concentration of Zn in the light guide layer 5 and the different diffusion constants of the layers 2 and 7, is illustrated by a broken line. Because of the difference in diffusion coefficients of Zn in the active layer 4 and the light guide layer 5, an abnormally large concentration of Zn can occur near the interface of the active layer 4 and the light guide layer 5, as shown in FIG. 3. The increased Zn concentration and the elevated temperatures employed in growing the various layers of the laser structure cause the Zn to diffuse into the active layer 4 that is desirably neither n-type nor p-type. The abnormally high Zn concentration at the interface effectively provides a high concentration diffusion source, accelerating the intrusion of Zn into the active layer 4. The Zn diffusion can occur during growth of the layers of the semiconductor laser, during other high temperature process steps in the fabrication of the laser, or during operation at elevated temperatures. When the concentration of Zn in the active layer 4 increases, undesired charge carrier recombination occurs in that layer, reducing the light output of the semiconductor laser. To compensate for the reduced light output, the current flowing through the laser may be increased, increasing the operating temperature of the laser, accelerating further Zn diffusion and premature failure, i.e., shortened lifetime, of the laser.

SUMMARY OF THE INVENTION

The present invention is directed to providing a semiconductor laser producing visible light of acceptable intensity from initial operation and during a long lifetime.

An object of the present invention is prevent dopant impurities in a semiconductor laser structure producing invisible light from premature intrusion into the active layer of the semiconductor laser and thereby causing a reduction in light output.

According to a first aspect of the invention, a semiconductor laser producing visible light includes a first conductivity type semiconductor substrate, a first conductivity type AlGaInP cladding layer containing a first dopant impurity and disposed on the substrate, a semiconductor spacer layer disposed on the cladding layer, an undoped InGaP active layer disposed on the spacer layer wherein the spacer layer inhibits intrusion of the first dopant impurity into the active layer, a second conductivity type AlGaInP light guide layer disposed on the active layer, a second conductivity type semiconductor current concentration and collection structure disposed on the light guide layer, and first and second electrodes disposed on the substrate and the current concentration and collection structure, respectively.

In another aspect of the invention, a semiconductor laser producing visible light includes a first conductivity type semiconductor substrate, a first conductivity type AlGaInP cladding layer disposed on the substrate, an undoped InGaP active layer disposed on the first conductivity type cladding layer, a semiconductor spacer layer disposed on the active layer, a second conductivity type AlGaInP light guide layer containing a first dopant impurity and disposed on the spacer layer wherein the spacer layer inhibits intrusion of the first dopant impurity into the active layer, a second conductivity type semiconductor current concentration and collection structure disposed on the light guide layer, and first and second electrodes disposed on the substrate and the current concentration and collection structure, respectively.

According to a third aspect of the invention, a semiconductor laser producing visible light includes a first conductivity type semiconductor substrate, a first conductivity type AlGaInP cladding layer containing a first dopant impurity and disposed on the substrate, a semiconductor first spacer layer disposed on the cladding layer, an undoped InGaP active layer disposed on the first spacer layer wherein the first spacer layer inhibits intrusion of the first dopant impurity into the active layer, a semiconductor second spacer layer disposed on the active layer, a second conductivity type AlGaInP light guide layer containing a second dopant impurity and disposed on the active layer wherein the second spacer layer inhibits intrusion of the second dopant impurity into the active layer, a second conductivity type semiconductor current concentration and collection structure disposed on the light guide layer, and first and second electrodes disposed on the substrate and the current concentration and collection structure, respectively.

Other objects and advantages of the present invention will become apparent from the detailed description that follows. The detailed description and specific embodiments of the invention are provided for illustration only, since various additions and modifications within the spirit and scope of the invention will be apparent to those of skill in the art from the detailed description.

BRIEF DESCRIPTION OF THE DRAWINGS

FIG. 5 is a graph showing light output as a function of the current density in a prior art laser and in a laser in accordance with the invention.

DETAILED DESCRIPTION OF PREFERRED EMBODIMENTS

Figure 1A:
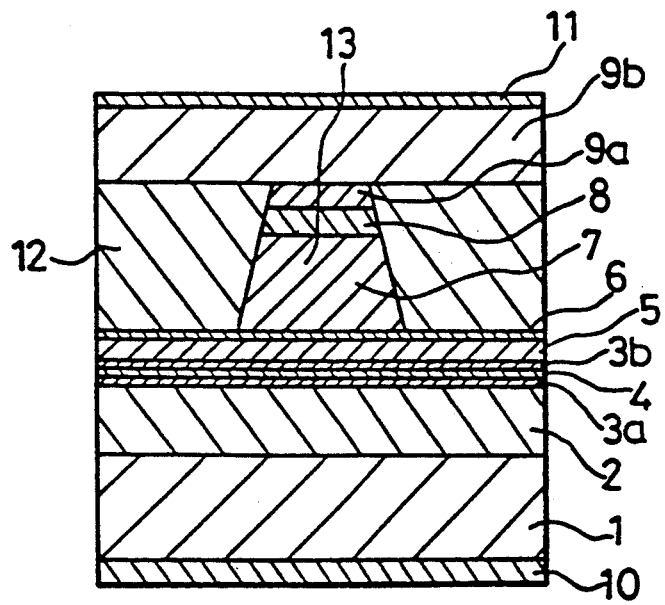
FIGS. 1(a) and 1(b) are a cross-sectional view and a perspective view, respectively, of a semiconductor laser producing visible light in accordance with an embodiment of the invention.
Figure 1B:
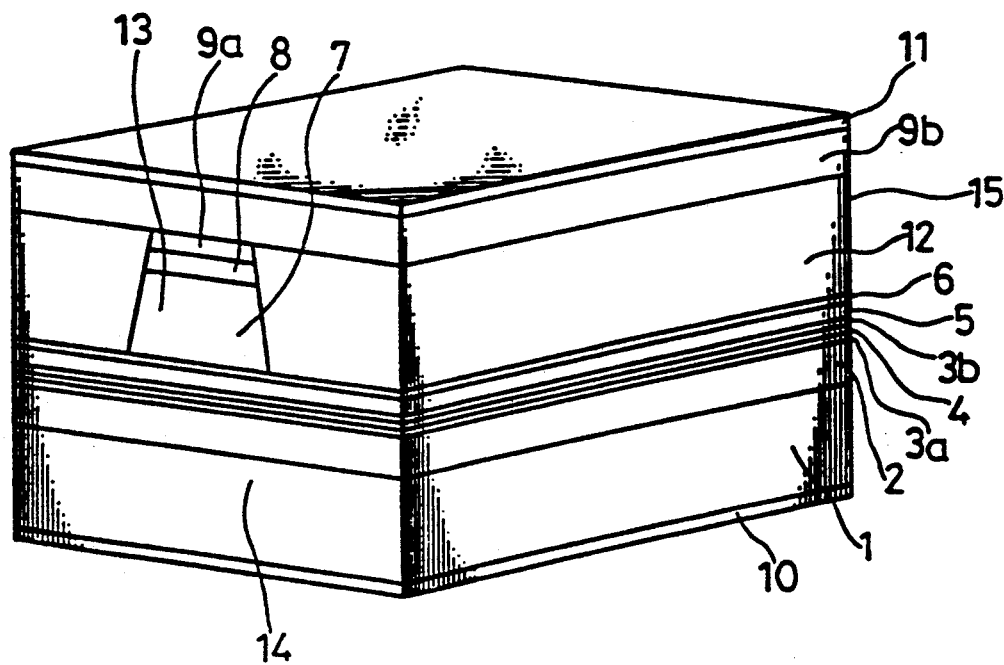

FIGS. 1(a) and 1(b) show cross-sectional and perspective views, respectively, of a semiconductor laser producing visible light in accordance with an embodiment of the invention. In these figures, the same reference numbers designate the same elements already described with respect to FIG. 2. The elements already described do not need to be described again. In addition to the elements of the prior art semiconductor laser structure of FIG. 2, the semiconductor laser structure of FIG. 1(a) includes a semiconductor first spacer layer 3a disposed between the n-type cladding layer 2 and the active layer 4 and a semiconductor second spacer 3b disposed between the active layer 4 and the light guide layer 5. The first and second spacer layers 3a and 3b are AlGaInP and, preferably, are undoped.

Figure 2:
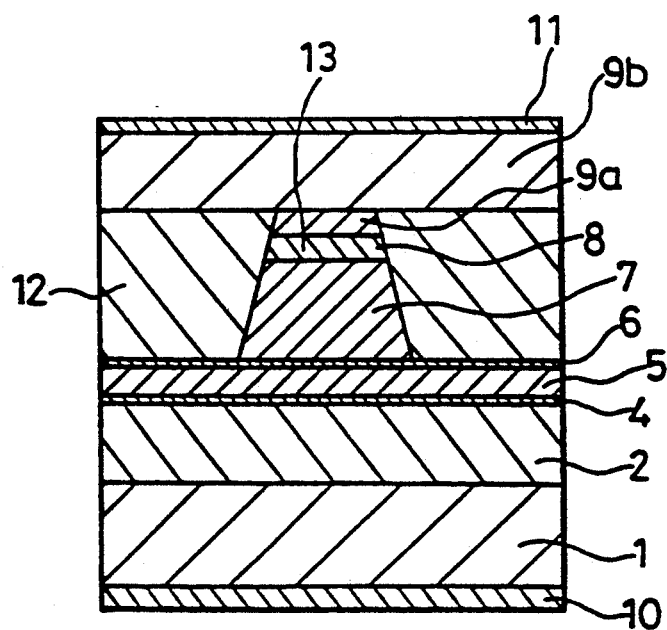
FIG. 2 is a cross-sectional view of a semiconductor laser producing visible light according to the prior art.
Figure 3:
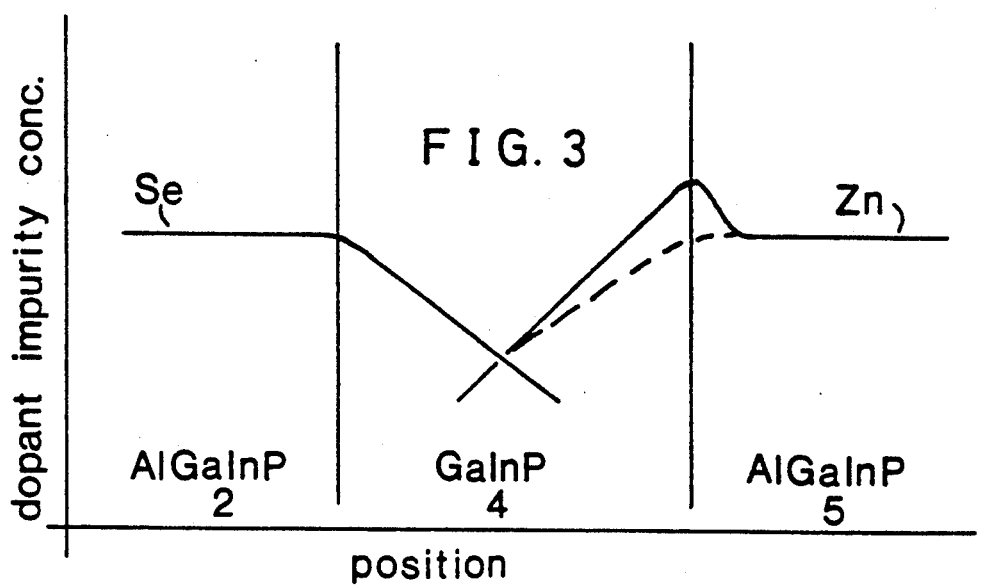
FIG. 3 is a graph of relative dopant impurity concentrations in the active layer and the layers adjacent the active layer in the prior art laser structure of FIG. 2.

The structure of FIG. 1(a) is prepared in the same manner as the structure of FIG. 2. However, after the growth of the cladding layer 2, the spacer layer 3a is grown before the active layer 4 is grown. Likewise, after the growth of the active layer 4 and before the growth of the light guide layer 5, the second spacer layer 3b is grown. Otherwise, the structure of FIG. 1(a) can be produced in the same way as the structure of FIG. 2 including cleaving to produce the opposed facets 14 and 15, shown in FIG. 1(b), transverse to the layers 2 through 11. The facets 14 and 15, with the active layer 4, the cladding layers 2 and 7, and the other layers between the cladding layers 2 and 6, form a resonant optical cavity that supports laser oscillation. The mesa 13 may be formed by etching the contacting layer 9a with equal volumes of tartaric acid and hydrogen peroxide, the InGaP transition layer 8 with equal volumes of hydrochloric and phosphoric acids, and the AlGaInP cladding layer with equal volumes of sulfuric acid and water. Typically, the first and second spacer layers 3a and 3b have the same compositions with respect to the proportions of Al, Ga, and In as the cladding and light guide layers 2 and 5. The layers employed in the laser structure typically have the following thicknesses:

TABLE 1

| Layer | Thickness |
| --- | --- |
| claddng layer 2 | 1 micron |
| spacer layer 3a | 0.05 to 0.1 micron |
| active layer 4 | 0.05 to 0.1 micron |

TABLE 1-continued

| Layer | Thickness |
|---|---|
| spacer layer 3b | 0.05 to 0.1 micron |
| light guide layer 5 | 0.3 micron |
| etch stopping layer 6 | 0.005 to 0.01 micron |
| cladding layer 7 | 0.7 micron |
| transition layer 8 | 0.1 micron |
| contacting layer 9a | 0.1 to 0.4 micron |
| contacting layer 9b | 3 microns. |

In the embodiment of the invention shown in FIG. 1(a), if Zn atoms diffuse from the light guide layer 5 toward the active layer 4, they must first pass through the spacer layer 3b. While spacer layer 3b is quite thin, it is preferably not intentionally doped and, thereby, acts as a sink for the diffusing Zn atoms, preventing the Zn atoms from reaching the active layer 4. Likewise, the dopant impurity, such as Se and Si, producing the n-type conductivity in the cladding layer 2 is prevented from reaching the active layer 4 by the preferably undoped first spacer layer 3a. Together, the spacer layers 3a and 3b prevent or delay the recognized interaction between Zn and Se atoms, thereby maintaining the active layer 4 as an undoped layer for a relatively long period of time. The delay in the intrusion of dopant impurities into the active layer 4 extends the lifetime of the laser by preventing a premature decrease in the light output for a particular current density flowing through the laser. Because the intrusion of dopant impurities is prevented both initially and during operation of the laser, the lifetime of the laser is extended as compared to the prior art structure.

Figure 4A:
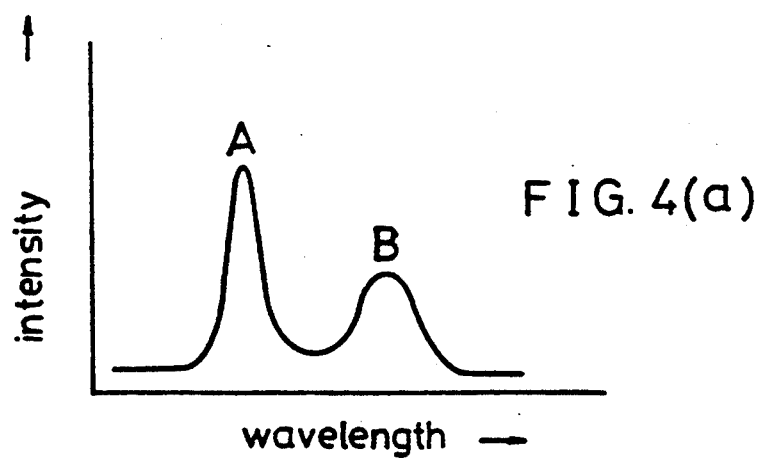
FIGS. 4(a) and 4(b) are graphs of the photo-luminescence spectra of the active layers of a prior art laser and of a laser in accordance to the invention, respectively.
Figure 4B:
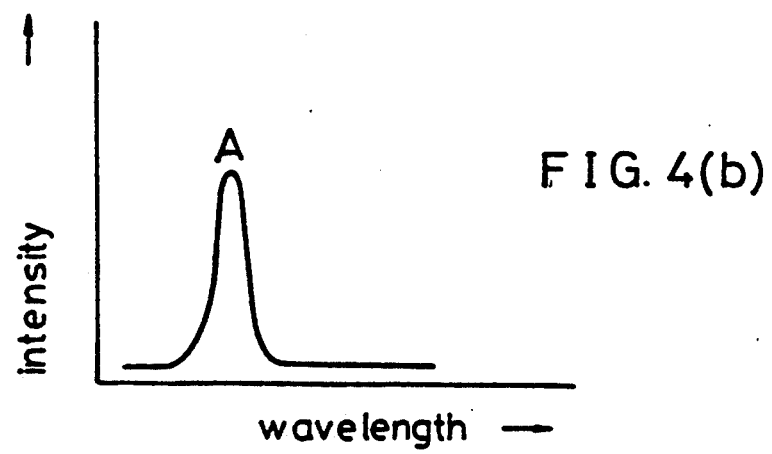

In order to test the effectiveness of the spacer layers in the invention, the photoluminescence spectra of active layers of laser diodes according to the invention and of laser diodes according to the prior art were measured. Laser structures were fabricated according to the prior art and according to the invention and the overlying layers, including a spacer layer, were removed to expose the active layers. The active layers thus exposed were subjected to incident light and the spectrum of the resulting luminescence measured. Examples of the measured spectra are shown in FIG. 4(a) for the prior art laser structure and in FIG. 4(b) for the laser structure according to the invention. In FIG. 4(a), two emission peaks labeled A and B were observed. The peak A is attributable to the inherent characteristics of the active layer whereas the peak B is attributable to transitions to a Zn dopant energy level, i.e., to Zn atoms, that are present within the active layer of the prior art structure. By contrast, in the structure according to the embodiment of the invention, only the luminescence peak A is observed, confirming that Zn has not diffused into the active layer 4 during fabrication of the laser structure.

In addition to the advantage of extended lifetime achieved in the invention, a laser according to the invention has a reduced threshold current density for producing laser oscillation as well as increased efficiency, i.e., light output, for a particular current density. In FIG. 5, the measured light output as a function of current density is plotted both for a semiconductor laser according to the prior art and a semiconductor laser according to the invention. Relative light output is plotted on the ordinate and the current density for the respective laser structures is plotted on the abscissa. As shown in FIG. 5, the threshold current density $J_{th}$ for the laser according to the invention is about thirty percent less than the current density for the laser structure according to the prior art. In addition, a relatively intense light output is produced by the laser according to the invention before laser oscillation even begins in the laser according to the prior art.

In the specific embodiment of the invention described with respect to FIG. 1(a), the spacer layers 3a and 3b are AlGaInP. However, other materials, such as AlGaAs, may be employed as the spacer layers. Preferably, the spacer layers have a lower index of refraction and a higher energy band gap than the active layer. For an active layer of the approximate composition $Ga_{0.5}In_{0.5}P$, a spacer layer $Al_xGa_{1-x}As$ should have $x > 0.6$. The spacer layers are preferably very thin, e.g., 0.05 to 0.1 micron, and, therefore, do not adversely affect the electrical properties of the laser while effectively inhibiting the intrusion of dopant impurities into the active layer.

Although the embodiment of the invention shown in FIG. 1(a) includes two spacer layers 3a and 3b, each spacer layer contributes to the advantages achieved in the invention. The prevention of dopant impurity diffusion into the active layer can be at least partially achieved even if only one of the spacer layers 3a and 3b is present in the structure. The interaction between Se and Zn produces enhanced adverse effects when both dopant impurities reach the active layer 4. Thus, the presence of only one of the spacer layers retarding the intrusion of either Zn or Se is effective to extend the lifetime and reduce the threshold current of a semiconductor laser. An interaction similar to that of Se and Zn but smaller in effect exists for Si and Zn. Therefore, the advantages of the invention are achieved with only one of the spacer layers present regardless of the dopant producing n-type conductivity in the cladding layer 2.

The structure of FIG. 1(a) is described with certain layers of p-type conductivity and other layers of n-type conductivity. However, the respective conductivities of the various layers can be reversed while achieving the advantages of the invention since it is the exclusion of dopant impurities from the active layer that is desired without regard to the layer that is the source of the dopant impurities.

The embodiment of the invention shown in FIG. 1(a) employs a current concentration and collection structure having a forward mesa including layers 7, 8, 9a, and 9b of p-type conductivity and the n-type current blocking layer 12. However, the invention is equally applicable to laser structures employing different current concentration and collection structures. Those structures concentrate the current flow in the central portion of the active layer for laser oscillation and current collection. Examples of such structures are forward and reverse mesa structures, i.e., structures in which the side surfaces converge and diverge in the direction of the active layer, respectively, and stripe groove structures. The type of mesa, i.e., forward and reverse, can be altered merely by changing the orientation of the etching mask relative to the crystallographic orientation of the substrate. In stripe groove structures, the current blocking layer is grown before the second cladding layer is grown. The current blocking layer is etched to expose the underlying active layer or a light guide layer. Therefore, the second cladding layer is grown on the current blocking layer and exposed underlying layer. In summary, the particular cross-sectional shape of the current concentration and collection structure of the laser disposed on the side of the active layer 4 opposite the substrate 1 is not critical to the novel structure nor the advantages provided by the novel structure.

I claim:

1. A semiconductor laser producing visible light comprising:
   a first conductivity type semiconductor substrate;
   a first conductivity type AlGaInP cladding layer containing a first dopant impurity disposed on said substrate;
   a semiconductor spacer layer disposed on said cladding layer;
   an undoped InGaP active layer disposed on said spacer layer wherein said spacer layer inhibits intrusion of said first dopant impurity into said active layer;
   a second conductivity type AlGaInP light guide layer disposed on said active layer;
   a second conductivity type semiconductor current concentration and collection structure disposed on said light guide layer;
   first and second opposed facets transverse to said cladding layer, said spacer layer, said active layer, and said light guide layer forming a resonant optical cavity for supporting laser oscillation; and
   first and second electrodes disposed on said substrate and said current concentration and collection structure, respectively.

2. The semiconductor laser of claim 1 wherein said spacer layer is undoped.

3. The semiconductor laser of claim 2 wherein said spacer layer is AlGaInP.

4. The semiconductor laser of claim 2 wherein said spacer layer is $Al_xGa_{1-x}As$.

5. The semiconductor laser of claim 4 wherein $x > 0.6$.

6. The semiconductor laser of claim 1 wherein said first dopant impurity is selected from the group consisting of Se and Si.

7. The semiconductor laser of claim 1 wherein said light guide layer contains a second dopant impurity.

8. The semiconductor laser of claim 7 including a semiconductor second spacer layer disposed between said active layer and said light guide layer inhibiting intrusion of said second dopant impurity into said 9. The semiconductor laser of claim 8 wherein said second dopant impurity is Zn.

10. The semiconductor laser of claim 1 including an InGaP etch stopping layer disposed between said light guide layer and said current concentration and collection structure.

11. The semiconductor laser of claim 1 wherein said current concentration and collection structure comprises an AlGaInP second cladding layer disposed on said light guide layer and a second conductivity type GaAs contacting layer disposed between said second cladding layer and said second electrode.

12. The semiconductor laser of claim 11 wherein said current concentration and collection structure comprises an InGaP transition layer disposed between said second cladding layer and said contacting layer.

13. A semiconductor laser producing visible light comprising:
   a first conductivity type semiconductor substrate;
   a first conductivity type AlGaInP cladding layer disposed on said substrate;
   an undoped InGaP active layer disposed on said first conductivity type cladding layer;
   a semiconductor spacer layer disposed on said active layer;
   a second conductivity type AlGaInP light guide layer containing a first dopant impurity and disposed on said spacer layer wherein said spacer layer inhibits intrusion of said first dopant impurity into said active layer;
   a second conductivity type semiconductor current concentration and collection structure disposed on said light guide layer;
   first and second opposed facets transverse to said cladding layer, said active layer, said spacer layer, and said light guide layer forming a resonant optical cavity for supporting laser oscillation; and
   first and second electrodes disposed on said substrate and said current concentration and collection structure, respectively.

14. The semiconductor laser of claim 13 wherein said spacer layer is undoped.

15. The semiconductor laser of claim 14 wherein said spacer layer is AlGaInP.

16. The semiconductor laser of claim 14 wherein said spacer layer is $Al_xGa_{1-x}As$.

17. The semiconductor laser of claim 16 wherein $x > 0.6$.

18. The semiconductor laser of claim 13 wherein said first dopant impurity is Zn.

19. The semiconductor laser of claim 13 wherein said first conductivity type cladding layer contains a second dopant impurity.

20. The semiconductor laser of claim 19 wherein said second dopant impurity is selected from the group consisting of Se and Si.

21. The semiconductor laser of claim 13 including an InGaP etch stopping layer disposed between said light guide layer and said current concentration and collection structure.

22. The semiconductor laser of claim 13 wherein said current concentration and collection structure comprises an AlGaInP second cladding layer disposed on said light guide layer and a second conductivity type GaAs contacting layer disposed between said second cladding layer and said second electrode.

23. The semiconductor laser of claim 22 wherein said current concentration and collection structure comprises an InGaP transition layer disposed between said second cladding layer and said contacting layer.

* * * * *

UNITED STATES PATENT AND TRADEMARK OFFICE
CERTIFICATE OF CORRECTION

PATENT NO. : 5,177,757

DATED : January 5, 1993

INVENTOR(S) : Mari Tsugami

It is certified that error appears in the above-identified patent and that said Letters Patent is hereby corrected as shown below:

Claim 8, col. 7, line 43, after "said" (second occurrence) insert --active layer--.

Signed and Sealed this

Nineteenth Day of October, 1993

Attest:

BRUCE LEHMAN

Attesting Officer     Commissioner of Patents and Trademarks